United States Patent
Patalay et al.

(10) Patent No.: US 9,570,328 B2
(45) Date of Patent: Feb. 14, 2017

(54) SUBSTRATE SUPPORT FOR USE WITH MULTI-ZONAL HEATING SOURCES

(75) Inventors: Kailash Patalay, San Jose, CA (US); Errol Sanchez, Tracy, CA (US)

(73) Assignee: APPLIED MATERIALS, INC., Sanata Clara, CA (US)

(*) Notice: Subject to any disclaimer, the term of this patent is extended or adjusted under 35 U.S.C. 154(b) by 991 days.

(21) Appl. No.: 13/155,943

(22) Filed: Jun. 8, 2011

(65) Prior Publication Data

US 2012/0003599 A1 Jan. 5, 2012

Related U.S. Application Data

(60) Provisional application No. 61/360,420, filed on Jun. 30, 2010.

(51) Int. Cl.
*F24J 3/00* (2006.01)
*H01L 21/67* (2006.01)
*H01L 21/687* (2006.01)

(52) U.S. Cl.
CPC ... *H01L 21/67115* (2013.01); *H01L 21/68735* (2013.01); *H01L 21/68742* (2013.01)

(58) Field of Classification Search
USPC ............ 432/227; 269/287; 118/50, 500, 728
See application file for complete search history.

(56) References Cited

U.S. PATENT DOCUMENTS

| 5,531,835 A | 7/1996 | Fodor et al. |
| 6,106,628 A | 8/2000 | Takahashi |
| 6,188,044 B1* | 2/2001 | Lee et al. ........................ 219/390 |
| 6,634,882 B2 | 10/2003 | Goodman |
| 6,652,650 B2 | 11/2003 | Yang et al. |
| 7,223,308 B2* | 5/2007 | Pancham et al. ............. 118/500 |
| 7,585,371 B2* | 9/2009 | Blomiley .............. C23C 14/505 |
| | | 118/725 |
| 2003/0140850 A1 | 7/2003 | Keeton et al. |

(Continued)

FOREIGN PATENT DOCUMENTS

| EP | 0 634 785 A1 | 1/1995 |
| JP | 2005050841 A | 2/2005 |

OTHER PUBLICATIONS

International Search Report and Written Opinion mailed Feb. 10, 2012 for PCT Application No. PCT/US2011/040334.

*Primary Examiner* — Alissa Tompkins
*Assistant Examiner* — John Bargero
(74) *Attorney, Agent, or Firm* — Moser Taboada; Alan Taboada

(57) ABSTRACT

Apparatus for use with multi-zonal heating sources are provided. In some embodiments, a substrate support may have a pocket disposed in a surface of the substrate support and a lip disposed about the pocket to receive an edge of a substrate and to support the substrate over the pocket such that a gap is defined between a pocket surface and a backside surface of the substrate when the substrate is disposed on the lip; a plurality of features to operate in combination with a plurality of heating zones provided by a multi-zonal heating source to provide a desired temperature profile on a frontside surface of a substrate when the substrate is disposed on the lip, and wherein the plurality of features are alternatingly disposed above and below a baseline surface profile of the pocket surface in a radial direction from a central axis of the substrate support.

20 Claims, 4 Drawing Sheets

(56) References Cited

U.S. PATENT DOCUMENTS

| | | | |
|---|---|---|---|
| 2005/0051099 A1 | 3/2005 | Preti et al. | |
| 2006/0180084 A1* | 8/2006 | Blomiley | C23C 16/4586 118/725 |
| 2008/0170842 A1* | 7/2008 | Hunter et al. | 392/416 |
| 2009/0274454 A1* | 11/2009 | Aderhold et al. | 392/416 |

* cited by examiner

SUBSTRATE SUPPORT FOR USE WITH MULTI-ZONAL HEATING SOURCES

CROSS-REFERENCE TO RELATED APPLICATIONS

This application claims benefit of U.S. provisional patent application Ser. No. 61/360,420, filed Jun. 30, 2011, which is herein incorporated by reference.

FIELD

Embodiments of the present invention generally relate to substrate processing systems.

BACKGROUND

Multi-zonal lamp heating may be utilized to provide thermal energy to multiple zones on a substrate for improved process uniformity tuning during substrate processes such as, for example, during an epitaxial deposition process. However, the inventors have discovered that conventional substrate supports used to support the substrate during processing with multi-zonal lamps detrimentally act to diffuse the thermal zones, thereby inhibiting the benefit of process uniformity tuning from the multi-zonal lamp heating process.

Accordingly, the inventors have developed improved substrate supports configured to operate in combination with a multi-zonal radiant energy source to provide a desired temperature profile to a substrate disposed on the substrate support.

SUMMARY

Apparatus for use with multi-zonal heating sources are provided. In some embodiments, a substrate support may have a pocket disposed in a surface of the substrate support and a lip disposed about the pocket to receive an edge of a substrate and to support the substrate over the pocket such that a gap is defined between a pocket surface and a backside surface of the substrate when the substrate is disposed on the lip; a plurality of features to operate in combination with a plurality of heating zones provided by a multi-zonal heating source to provide a desired temperature profile on a frontside surface of a substrate when the substrate is disposed on the lip, and wherein the plurality of features are alternatingly disposed above and below a baseline surface profile of the pocket surface in a radial direction from a central axis of the substrate support.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
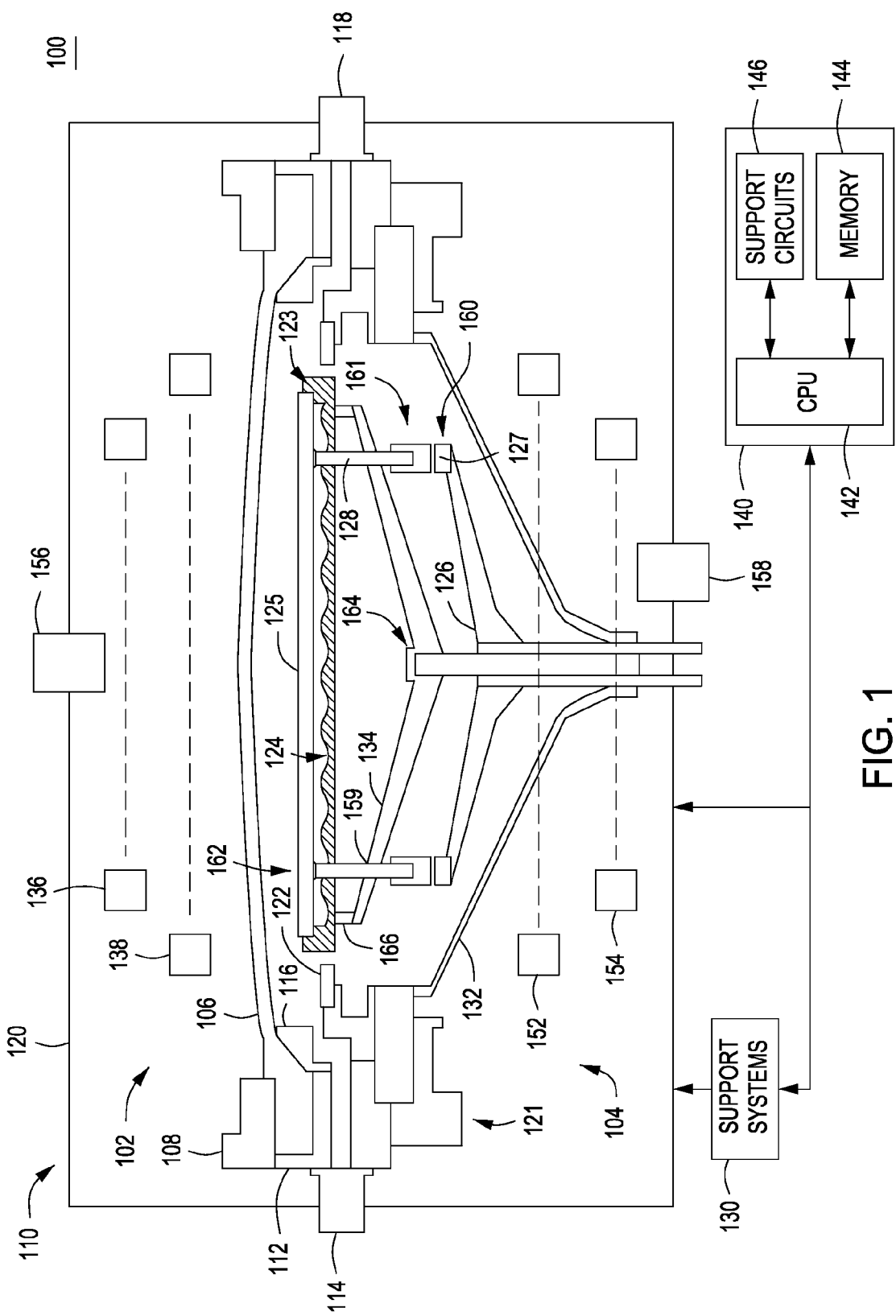
FIG. 1 depicts a schematic side view of a substrate processing system in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of substrate supports and substrate processing systems having such substrate supports are disclosed herein. The inventive substrate supports and processing systems are configured to operate in combination with a multi-zonal heating source to advantageously provide a desired temperature profile on a substrate when present on the substrate support.

The inventive apparatus disclosed herein may include or be utilized in any suitable process chamber that uses multi-zonal heat sources to heat a substrate. Examples of suitable substrate processing systems include systems adapted for performing epitaxial deposition processes, such as the RP EPI® reactor, available from Applied Materials, Inc. of Santa Clara, Calif. The inventive substrate supports may also be used with other thermal processing chambers, such as chemical vapor deposition (CVD) chambers, rapid thermal processing (RTP) chambers, or other chambers having multi-zonal heating.

An exemplary process chamber is described below with respect to FIG. 1, which depicts a schematic, cross-sectional view of a substrate process chamber 100 suitable for use with embodiments of the present invention. The process chamber 100 may be adapted for performing epitaxial deposition processes as discussed above and illustratively comprises a chamber body 110 having an inventive substrate support 124 disposed therein and a multi-zonal heating source (e.g., a multi-zonal energy source). In some embodiments, the multi-zonal energy source may be a multi-zonal radiant energy source, such as provided by one or more of lamps 136, 138, 152, 154 shown in the substrate process chamber 100 of FIG. 1.

The chamber body 110 generally includes an upper portion 102, a lower portion 104, and an enclosure 120. The upper portion 102 is disposed on the lower portion 104 and includes a lid 106, a clamp ring 108, a liner 116, a baseplate 112, one or more upper lamps 136 and one or more lower lamps 138, and an upper pyrometer 156. In one embodiment, the lid 106 has a dome-like form factor, however, lids having other form factors (e.g., flat or reverse curve lids) are also contemplated. The lower portion 104 is coupled to a process gas intake port 114 and an exhaust port 118 and comprises a baseplate assembly 121, a lower dome 132, a substrate support 124 having a substrate support 123, a pre-heat ring 122, a substrate lift assembly 160, a substrate support assembly 164, one or more upper lamps 152 and one or more lower lamps 154, and a lower pyrometer 158. Although the term "ring" is used to describe certain components of the process chamber, such as the pre-heat ring 122, it is contemplated that the shape of these components need not be circular and may include any shape, including but not limited to, rectangles, polygons, ovals, and the like.

Figure 2A:
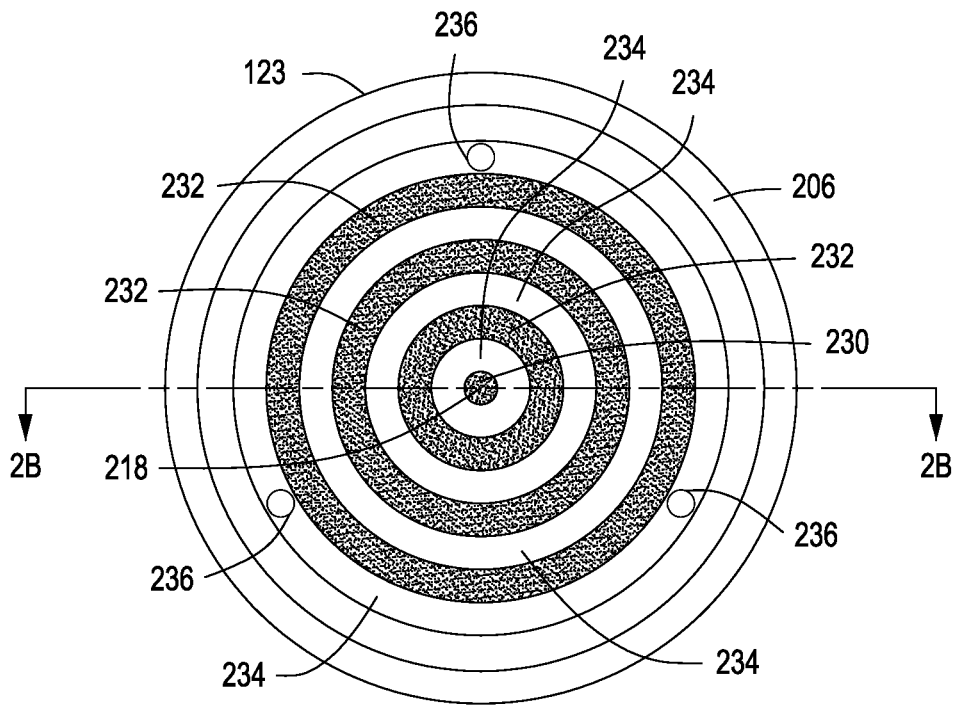
FIGS. 2A-B depict a side cross sectional view and a top-down view of a substrate support in accordance with some embodiments of the present invention.
Figure 2B:
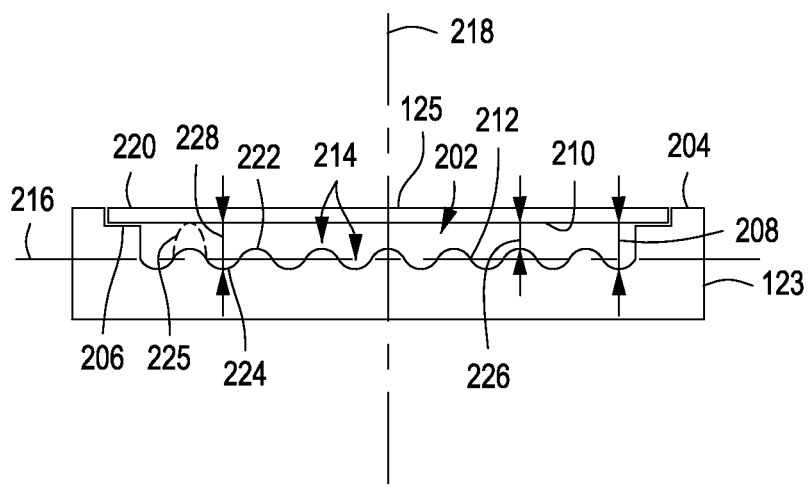

The substrate support 123 provides a support for a substrate during processing and is configured to work in concert with a multi-zonal energy source, such as lamps 136, 138, 152, 154. For example, the substrate support 123 may be a susceptor. FIGS. 2A-B depict a side cross sectional view (FIG. 2B) and a top-down view (FIG. 2A) of the substrate support 123 in accordance with some embodiments of the present invention. As illustrated in cross sectional view in FIG. 2B, the substrate support 123 may include a pocket 202 disposed in an upper surface 204 of the substrate support 123 and a ledge, or lip 206 disposed about a periphery of the pocket 202. The lip 206 may be configured to receive an edge of a substrate 125 (for example, in an edge exclusion region of the substrate) and to support the substrate 125 over the pocket to define a gap 208 between a backside surface 210 of the substrate 125 when disposed on the lip 206 and a pocket surface 212.

The pocket surface has a modulated contoured profile with a plurality of defined areas having relatively greater or lesser rates of heat transfer in each defined area. For example, the pocket surface 212 includes a plurality of features 214 alternatingly disposed above and below a baseline surface profile 216 (or average profile) of the pocket surface 212 in a radial direction from a central axis 218 of the substrate support 123. The plurality of features 214 are configured to operate in combination with a plurality of radiant energy zones provided by a multi-zonal radiant energy source to provide a desired temperature profile on a frontside surface 220 of the substrate 125 when present on the lip 206 as discussed below and illustrated in FIGS. 3-4. The plurality of features 214 define a varying profile of the gap 208 that varies the thermal conductance across the gap 208. For example, the plurality of features 214 are configured to provide regions of increased rates of heat transfer between the substrate support 123 and the substrate 125 and regions of decreased rates of heat transfer between the substrate support 123 and the substrate 125.

The plurality of features 214 may include at least one peak 222 disposed above the baseline surface profile 216 of the pocket surface 212 and at least one valley 224 disposed below the baseline surface profile 216 of the pocket surface 212. The baseline surface profile 216 may be linear, curved, or any geometry as desired to assist in providing a desired temperature profile on the substrate 125 during processing. In the illustrative embodiment shown in FIG. 2A, the baseline profile is concave providing a gap 208 that is generally smaller proximate the edges of the substrate 125 and generally larger proximate the center of the substrate 125.

For example, a first portion 226 of the gap 208 defined between a maximum in the peak height of the at least one peak 222 and a backside surface of the substrate 125 when disposed on the lip 206 may be smaller than a second portion 228 of the gap 208 defined between a maximum depth of the at least one valley 224 and the backside surface of the substrate 125 when disposed on the lip 206. Each peak 222 is part of a region of a relatively increased rate of heat transfer between the 123 and the substrate 125 and each valley 224 is part of a regions of a relatively decreased rate of heat transfer between the 123 and the substrate 125. Each peak, and each valley, can be disposed at varying distances above, or below, the baseline surface profile 216.

In some embodiments, one or more at least one peak 222 may be configured to contact the backside surface 210 of the substrate 125 as illustrated in FIG. 2B by the dotted peak 225 contacting the backside surface 210. The at least one peak 222 may contact the backside surface 210, for example, to maximize heat transfer between the backside surface 210 of the substrate 125 and the substrate support 123 at the contact point.

When radiant energy is provided from above the substrate 125, each peak 222 may be utilized to reduce heating in the regions of the substrate 125 disposed above the at least one peak 222 by providing increased rates of heat transfer from the substrate 125 to the substrate support 123 in those regions. The at least one valley 224 may be utilized to increase heating in the regions of the substrate 125 disposed above the at least one valley 224 by providing reduced rates of thermal transfer from the substrate 125 to the substrate support 123 in those regions. Alternately, when radiant energy is provided from below the substrate 125, the at least one peak 222 may be utilized to increase heating in the regions of the substrate 125 disposed above the at least one peak 222 by providing increased rates of heat transfer to the substrate 125 from the substrate support 123 in those regions. The at least one valley 224 may be utilized to decrease heating in the regions of the substrate 125 disposed above the at least one valley 224 by providing reduced rates of thermal transfer to the substrate 125 from the substrate support 123 in those regions. When radiant energy is provided from both above and below the substrate, the peaks and valleys will facilitate control of the thermal profile on the substrate based upon the relative temperature of the substrate 125 and the substrate support 123 in the regions corresponding to the peaks 222 and valleys 224 (or other features 214).

In some embodiments, for example as respectively illustrated in the top-down and side cross-sectional views of the substrate support 123 in FIGS. 2A-B, the at least one peak 222 and the at least one valley 224 are concentrically disposed about the central axis 218 of the substrate support 123. In some embodiments, one of the at least one peaks 222 may be a raised feature 230 having a center that coincides with the central axis 218. In some embodiments, the raised feature 230 may be conical. Alternatively or in combination, in some embodiments, the at least one peak 222 may be a ring 232 having a peak cross section continuously and concentrically disposed about the central axis 218 of the substrate support 123. Alternatively, and not shown, the at least one peak 222 may include a plurality of raised features arranged in a desired geometry, such as a ring. For example, a plurality of raised features may be arranged in a ring concentrically disposed about the central axis 218 of the substrate support 123.

Similarly, the at least one valley 224 may be a depressed feature (not shown) and having a center of the depressed feature which coincides with the central axis 218 of the substrate support (for example, the inverse of the peaks and valleys shown in FIGS. 2A-B). In some embodiments, the depressed feature may be conical. Alternatively or in combination, in some embodiments, and as illustrated in FIG. 2A, the at least one valley 224 may be a ring 234 having a valley cross section continuously and concentrically disposed about the central axis 218 of the substrate support 123. Alternatively, and not shown, the at least one valley 224 include a plurality of depressed features arranged in a desired geometry, such as a ring. For example, a plurality of depressed features may be arranged in a ring concentrically disposed about the central axis 218 of the substrate support 123.

In some embodiments, such as illustrated in FIG. 2A, the at least one peak 222 comprises a plurality of peaks and the at least one valley 224 comprises a plurality of valleys 224. For example, as illustrated in FIG. 2A, the plurality of peaks comprises the raised feature 230 having a center coinciding with the central axis 218 of the substrate support 123 and a plurality of rings 232 alternatingly disposed between a plurality of valleys 224. As illustrated, the plurality of valleys 224 comprises a plurality of rings 234 alternatingly disposed between the rings 232 of the plurality of peaks 222. As discussed above, additional configurations of the pocket surface 212 are possible, including a depressed feature coinciding with the central axis 218 of the substrate support 123, and/or a combination of ring and raised features, and/or a combination of ring and depressed features.

In addition, as illustrated in FIG. 2A, a plurality of lift pin holes 236 may be disposed in the pocket surface 212, extending through the substrate support 123. The plurality of lift pin holes 236 each support a lift pin 128 (illustrated in FIG. 1 and discussed below) when the lift pin 128 is in a retracted position and permit the lift pin 128 to move through the lift pin hole 236 to contact the backside surface 210 of the substrate 125. As illustrated in FIG. 2A, the plurality of lift pin holes 236 are disposed in the final ring 234 of the valley 224 proximate the lip 206. However, the location of each lift pin hole 236 is merely illustrative, and the lift pin holes 236 may be in any suitable location on the pocket surface 212 appropriate to minimize temperature variation on the frontside surface 220 of the substrate 125.

The substrate support 123 may be fabricated from any process-compatible materials having suitable thermal properties, such as a low thermal mass, and a very high thermal conductivity, or the like, to create a desired thermal profile on the frontside surface 220 of the substrate 125. For example, the substrate support 123 may comprise one or more materials having a thermal mass of less than about 1000 Joules/Kelvin (J/K). The substrate support 123 may comprises one or more materials having a thermal conductivity of at least 50 Watts/mete·Kelvin (W/m·K), or ranging from about 50 W/m·K to about 300 W/m·K at room temperature. Such materials may include silicon carbide (SiC), silicon nitride (SiN), aluminum nitride (AlN), boron nitride (BN), or the like. In some embodiments, the 123 may be fabricated completely from such materials, as compared to CVD silicon carbide coated graphite (e.g., the 123 may be solid silicon carbide, solid silicon nitride, or the like).

Figure 3A:
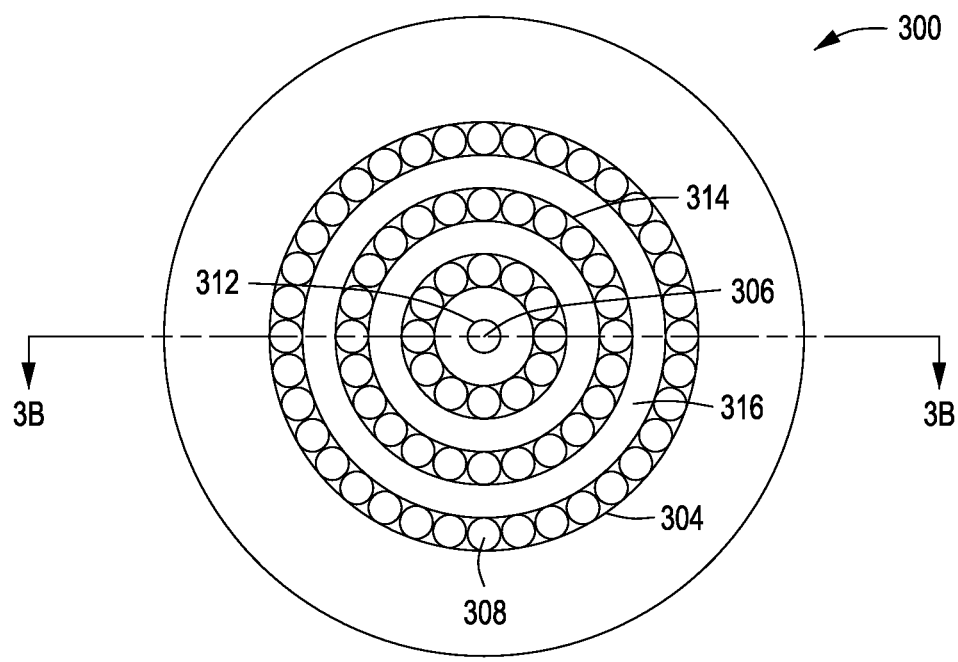
FIGS. 3A-B depict a side cross sectional view and a top-down view of a multi-zonal radiant energy source suitable for use with substrate supports in accordance with some embodiments of the present invention.
Figure 3B:
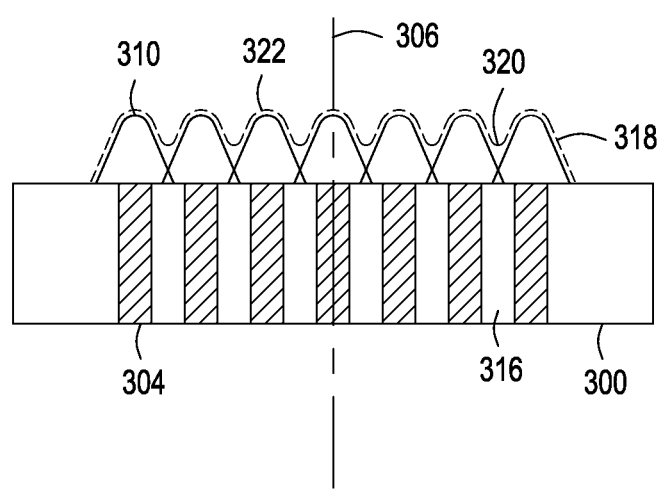

FIGS. 3A-B depict a top-down view (FIG. 3A) and a side cross sectional view (FIG. 3B) of an illustrative multi-zonal radiant energy source 300 suitable for use with substrate supports in accordance with some embodiments of the present invention. The multi-zonal radiant energy source 300 may comprise a plurality of radiant energy zones 304 to provide radiant energy incident on the substrate support 123 from either above or below. Although illustrated as having up to four radiant energy zones in FIGS. 3A-B, the multi-zonal radiant energy source 300 may have any desired number of radiant energy zones necessary to operate in combination with the plurality of features 214 to provide a desired temperature profile on a frontside surface of a substrate (e.g., the substrate 125) when present on the lip 206 of the substrate support 123.

The multi-zonal radiant energy source 300 may include a central axis 306 disposed perpendicular to the general plane of the energy source 300, as illustrated in FIGS. 3A-B. Each radiant energy zone 304 may include a plurality of lamps 308. In some embodiments, each lamp 308 of a given radiant energy zone 304 may be disposed at a substantially similar radial distance from the central axis 306 as illustrated in FIG. 3A. Alternatively (not shown), the lamps 308 in each zone 304 need not be arranged at a substantially similar radial distance and may assume other configurations, such as staggered (e.g., a first plurality of lamps 308 disposed a first radial distance in a zone 304 and a second plurality of lamps 308 disposed at a second radial distance in the same zone 304) or other suitable configurations which may provide a Gaussian, or other, cross section in radiant energy along a radial direction originating from the central axis 306 in each zone 304 (discussed below) or may operate in combination with the plurality of features 214 to provide a desired temperature profile on a frontside surface of the substrate 125 when present on the lip 206 of the substrate support 123.

For example, as illustrated in FIG. 3A, the radiant energy zones 304 may include a central zone 312 proximate the central axis 306 and a plurality of rings 314 disposed concentrically about the central zone 312. The central zone 312 and each ring 314 in the plurality may be spaced apart by a plurality of overlap regions 316. The radiant energy intensity (discussed below) between adjacent zones 304 can overlap in each overlap region 316. Further, although drawn as having a single lamp 308, the central zone 312 may include one or more lamps 308 disposed about the central axis 306.

As illustrated in cross sectional view in FIG. 3B, each radiant energy zone 304 may provide radiant energy having a Gaussian cross section 310 in radiant energy intensity along a radial direction that originates from the central axis 306 of the multi-zonal radiant energy source 300. For example, the Gaussian cross section 310 may be provided by each lamp 308 in a radiant energy zone 304 having the Gaussian cross section 310 or alternatively, a plurality of lamps 308 whose radiant energy intensities when summed is equivalent to the Gaussian cross section 310. Further, the cross section 310 need not be limited to a Gaussian line shape, and other lines shapes, for example such as Lorentzian or Voight line shapes, symmetric line shapes, asymmetric line shapes, or other desired profiles, are possible for the cross section of the radiant energy intensity in a radial direction across a given radiant energy zone 304.

Further, a summed cross section 318 in radiant energy intensity which is the summation of each Gaussian cross section 310 along a radial direction from the central axis 306 is depicted by the dotted line in FIG. 3A. In each overlap region 316, tails from adjacent Gaussian cross sections 310 in adjacent radiant energy zone 304 can overlap in additive way to form a minimum 320 in the summed cross section above the overlap region 316 and between adjacent maxima 322 in the summed cross section 318 above adjacent radiant energy zones 304.

Figure 4:
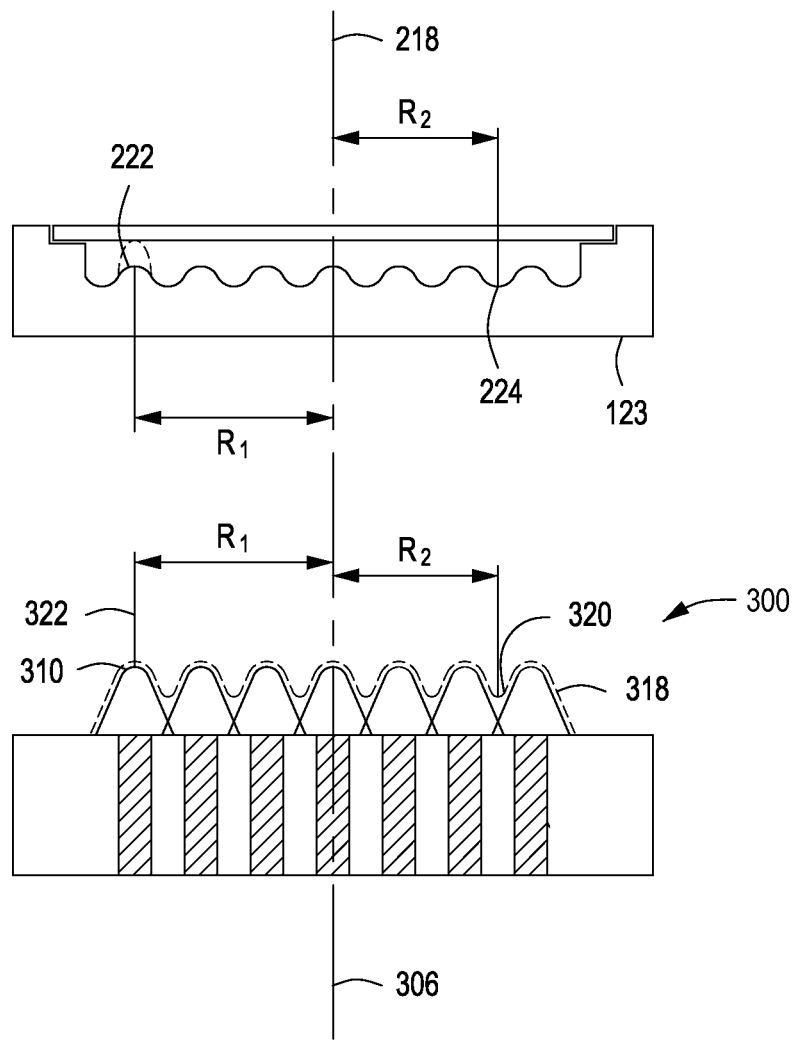
FIG. 4 depicts a side cross sectional view of a substrate support and a multi-zonal radiant energy source in accordance with some embodiments of the present invention.

The radiant energy intensity from each radiant energy zone 304 may be aligned with one or more of the features 214 in the pocket surface 212 of the substrate support 123 to provide a desired temperature profile on the frontside surface of the substrate 125 when present on the lip 206 of the substrate support 123. For example, FIG. 4 depicts a side cross sectional view of the substrate support 123 and the multi-zonal radiant energy source 300 in accordance with some embodiments of the present invention. As shown, the central axis 218 of the substrate support 123 and the central axis 306 of the multi-zonal radiant energy source 300 may be collinear. Further, the embodiments discussed in accordance with FIG. 4 may be applicable to an arrangement where the multi-zonal radiant energy source 300 is disposed below the substrate support 123 (as shown), where the multi-zonal radiant energy source 300 is disposed above the substrate support 123 (not shown), or combinations thereof.

In some embodiments, a maxima 322 of radiant energy intensity in each Gaussian cross section 310 or in the summed cross section 318 may be aligned, or coincident with a maximum height of a peak 222 (or maximum depth of a valley 224). For example, the maxima 322 may be disposed at a radial distance ($R_1$) from the central axis 306 of the multi-zonal radiant energy source 300 that is substantially equivalent to the radial distance for a maximum height of a peak 222 from the central axis 218 of the substrate support 123 as depicted in FIG. 4. Similarly, and in some embodiments, a minimum in the radiant energy intensity in the overlap region 316 (i.e., the minimum 320 of the summed cross section 318) may disposed at a radial distance ($R_2$) from the central axis 306 of the multi-zonal radiant energy source 300 that is substantially equivalent to that for a maximum depth of a valley 224 from the central axis 218 of the substrate support 123.

Further, the above discussed configurations of the radiant energy intensity and features of the substrate support 123, such as peaks 222 or valleys 224, are merely exemplary configurations. Other configurations are possible, for example, where a maximum height of a peak 222 coincides with the minimum 320 of the summed cross section 318 or where a maximum depth of a valley 224 coincides with the maximum 322 of the summed cross section 318, or any suitable configuration to provide a desire temperature profile on the frontside surface of the substrate 125 when disposed on the lip 206 of the substrate support 123. Further, the configurations of the radiant energy intensity and the features of the substrate support 123 may be tailored in any suitable manner, for example as discussed above, to provide a desired temperature profile which uniform or non-uniform along the frontside surface of the substrate 125. For example, a desired profile for the pocket surface 212 of the substrate support 123 which will produce a desired temperature profile on the frontside surface of the substrate 125 may be determined from a comparison between a film thickness profile deposited on the substrate 125 using a substrate support with a standard or conventional pocket surface and a multi-zonal radiant energy source and a desired film thickness profile. In some embodiments, or in combination with embodiments mentioned above, a desired temperature profile may be determined based on thermal gap sensitivity, where the thermal gap sensitivity may be defined as a change in temperature on the frontside surface of a substrate (or in the film thickness deposited for a particular application) per unit change in distance in a gap formed between the backside of the substrate and the pocket surface.

Returning to FIG. 1, and during processing, the substrate 125 is disposed on the substrate support 124. The lamps 136, 138, 152, and 154 are sources of infrared (IR) radiation (i.e., heat energy) and, in operation, are used to generate a pre-determined temperature distribution across the substrate 125. The lid 106, the clamp ring 116, and the lower dome 132 may be formed from quartz or other IR-transparent and process-compatible materials.

The substrate support assembly 164 generally includes a support bracket 134 having a plurality of support pins 166 coupled to the substrate support 124. The substrate lift assembly 160 comprises a substrate lift shaft 126 and a plurality of lift pin modules 161 selectively resting on respective pads 127 of the substrate lift shaft 126. In one embodiment, a lift pin module 161 comprises an optional upper portion of the lift pin 128 is movably disposed through a first opening 162 in the substrate support 124. In operation, the substrate lift shaft 126 is moved to engage the lift pins 128. When engaged, the lift pins 128 may raise the substrate 125 above the substrate support 124 or lower the substrate 125 onto the substrate support 124. Further, a rotation mechanism may be provided to rotate the substrate support 124 (and the substrate 125 when disposed thereon).

The support systems 130 include components used to execute and monitor pre-determined processes (e.g., growing epitaxial silicon films) in the process chamber 100. Such components generally include various sub-systems. (e.g., gas panel(s), gas distribution conduits, vacuum and exhaust sub-systems, and the like) and devices (e.g., power supplies, process control instruments, and the like) of the process chamber 100. These components are well known to those skilled in the art and are omitted from the drawings for clarity.

The controller 140 generally comprises a central processing unit (CPU) 142, a memory 144, and support circuits 146 and is coupled to and controls the process chamber 100 and support systems 130, directly (as shown in FIG. 1) or, alternatively, via computers (or controllers) associated with the process chamber and/or the support systems.

Thus, embodiments of substrate supports and substrate processing systems having such substrate supports have been disclosed herein. The inventive substrate processing systems include a substrate support configured to operate in combination with a multi-zonal heating sources to advantageously provide a desired temperature profile on a substrate when present on the substrate support. In addition, the inventive substrate supports disclosed herein may also be used in combination with multi-zonal heating elements disposed in the substrate support, or in other locations, rather than with heating lamps.

While the foregoing is directed to embodiments of the present invention, other and further embodiments of the invention may be devised without departing from the basic scope thereof.

The invention claimed is:

1. A substrate support for use with a multi-zonal heating source, comprising:
   a substrate support having a pocket disposed in a surface of the substrate support and a lip disposed about the pocket to receive an edge of a substrate and to support the substrate in a plane over the pocket such that a gap is defined between an exposed, substrate-facing pocket surface and a backside surface of the substrate when the substrate is disposed on the lip; and
   a plurality of geometric features in the pocket surface so that the pocket surface is non-planar, the plurality of geometric features operative in combination with a plurality of heating zones provided by a multi-zonal heating source to provide a desired temperature profile on a frontside surface of a substrate when the substrate is disposed on the lip;
   wherein the plurality of features are alternatingly disposed above and below a baseline surface profile of the pocket surface in a radial direction from a central axis of the substrate support, and
   wherein a highest point of at least one of the features disposed above the baseline surface profile is disposed beneath and spaced apart from the plane.

2. The substrate support of claim 1, wherein the plurality of features comprise:
   at least one peak disposed above the baseline surface profile of the pocket surface; and at least one valley disposed below the baseline surface profile of the pocket surface, wherein a first portion of the gap defined between a maximum peak height of the at least one peak and a backside surface of the substrate when disposed on the lip is smaller than a second portion of the gap defined between a maximum depth of the at least one valley and a backside surface of a substrate when disposed on the lip.

3. The substrate support of claim 2, wherein the at least one peak and at least one valley are concentrically disposed about the central axis of the substrate support.

4. The substrate support of claim 3, wherein in the at least one peak further comprises a plurality of peaks and the at least one valley further comprises a plurality of valleys.

5. The substrate support of claim 2, wherein at least one peak is configured to contact a backside surface of the substrate when present on the lip.

6. The substrate support of claim 1, wherein the substrate support comprises one or more materials having a thermal mass of less than about 1000 J/K.

7. The substrate support of claim 1, wherein the substrate support comprises one or more materials having a thermal conductivity ranging from about 50 W/m·K to about 300 W/m·K.

8. A substrate processing system, comprising:
a process chamber having a substrate support disposed therein, the substrate support having a pocket disposed in a surface of the substrate support and a lip disposed about the pocket to receive an edge of a substrate and to support the substrate in a plane over the pocket such that a gap is defined between an exposed, substrate-facing pocket surface and a backside surface of the substrate when the substrate is disposed on the lip, wherein the pocket surface includes a plurality of geometric features formed in the pocket surface and alternatingly disposed above and below a baseline surface profile of the pocket surface in a radial direction from a central axis of the substrate support so that the pocket surface is non-planar, and wherein at a highest point of least one of the features disposed above the baseline surface profile is disposed beneath and spaced apart from the plane; and
a multi-zonal energy source having a plurality of energy zones to provide energy incident on the substrate support, wherein the plurality of energy zones operate in combination with the plurality of features to provide a desired temperature profile on a frontside surface of a substrate when the substrate is disposed on the lip.

9. The processing system of claim 8, wherein the plurality of features further comprises:
at least one peak disposed above the baseline surface profile of the pocket surface; and
at least one valley disposed below the baseline surface profile of the pocket surface, wherein a first portion of the gap defined between a maximum height of the at least one peak and a backside surface of a substrate when disposed on the lip is smaller than a second portion of the gap defined between a maximum depth of the at least one valley and a backside surface of a substrate when disposed on the lip.

10. The processing system of claim 9, wherein the at least one peak and at least one valley are concentrically disposed about a central axis of the substrate support.

11. The processing system of claim 10, wherein in the at least one peak further comprises a plurality of peaks and the at least one valley further comprises a plurality of valleys.

12. The processing system of claim 11, wherein each energy zone of the multi-zonal energy source further comprises:
a plurality of lamps disposed radially about a central axis of the multi-zonal energy source, where each lamp in the energy zone is disposed at a substantially similar radial distance from the central axis of the multi-zonal energy source.

13. The processing system of claim 12, wherein the plurality of energy zones are disposed concentrically about the central axis of the multi-zonal energy source.

14. The processing system of claim 13, wherein the central axis of the multi-zonal energy source and the central axis of the substrate support are collinear.

15. The processing system of claim 14, wherein each energy zone provides radiant energy having a Gaussian cross section in radiant energy intensity along a radial direction that originates from the central axis of the multi-zonal energy source and wherein a maximum in radiant energy intensity of the Gaussian cross section of a given energy zone is disposed at a substantially equivalent radial distance from the central axis of the multi-zonal energy source as a maximum height of a corresponding peak of the plurality of peaks is disposed from the central axis of the substrate support.

16. The processing system of claim 8, wherein the desired temperature profile is non-uniform along the frontside surface of a substrate.

17. The processing system of claim 8, wherein the desired temperature profile is uniform along the frontside surface of a substrate.

18. The processing system of claim 8, wherein the plurality of features are formed integrally with the pocket surface.

19. A processing system, comprising: a process chamber; a substrate support disposed within the process chamber, the substrate support having a pocket disposed in a surface of the substrate support and a lip disposed about the pocket to receive an edge of a substrate and to support the substrate over the pocket such that a gap is defined between an exposed, substrate-facing pocket surface and a backside surface of the substrate when the substrate is disposed on the lip, wherein the pocket surface includes a plurality of geometric features formed in the pocket surface and alternatingly disposed above and below a baseline surface profile of the pocket surface in a radial direction from a central axis of the substrate support so that the pocket surface is non-planar, and wherein a highest point of at least one of the features disposed above the baseline surface profile is disposed beneath and spaced apart from the plane; and a multi-zonal energy source having a plurality of energy zones to provide energy incident on the substrate support, wherein the plurality of energy zones operate in combination with the plurality of features to provide a desired temperature profile on a frontside surface of a substrate when the substrate is disposed on the lip, wherein each of the plurality of energy zones include a plurality of lamps disposed radially about a central axis of the multi-zonal energy source, wherein each energy zone provides radiant energy having a Gaussian cross section of radiant energy intensity along a radial direction that originates from the central axis of the multi-zonal energy source, and wherein the Gaussian cross sections of radiant energy intensity from adjacent energy zones overlap, wherein a maximum in radiant energy intensity of the Gaussian cross section of a given energy zone is disposed at a substantially equivalent radial distance from the central axis of the multi-zonal energy source as a maximum height of a corresponding feature of the plurality of features above the baseline surface profile is disposed from the central axis of the substrate support, and wherein a maximum radiant energy intensity of a given overlap region between Gaussian cross sections of adjacent energy zones is disposed at a substantially equivalent radial distance from the central axis of the multi-zonal energy source as a maximum depth of a corresponding feature of the plurality of features below the baseline surface profile is disposed from the central axis of the substrate support.

20. The processing system of claim 8, wherein the lip supports the substrate in a plane over the pocket, and wherein at least one of the features disposed above the baseline surface profile is disposed below and spaced apart from the plane.

* * * * *